(12) United States Patent
Ohsawa et al.

(10) Patent No.: US 9,894,769 B2
(45) Date of Patent: Feb. 13, 2018

(54) BOARD AND CABLE CONNECTION BOARD

(71) Applicant: FUJITSU LIMITED, Kawasaki-shi, Kanagawa (JP)

(72) Inventors: Satoshi Ohsawa, Kawasaki (JP); Yoshihiro Morita, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/427,726

(22) Filed: Feb. 8, 2017

(65) Prior Publication Data

US 2017/0311449 A1    Oct. 26, 2017

(30) Foreign Application Priority Data

Apr. 25, 2016 (JP) ................. 2016-087351

(51) Int. Cl.
| | |
|---|---|
| H05K 1/11 | (2006.01) |
| H05K 1/18 | (2006.01) |
| H01R 4/02 | (2006.01) |
| H01R 12/53 | (2011.01) |

(52) U.S. Cl.
CPC ............ H05K 1/184 (2013.01); *H01R 4/02* (2013.01); *H01R 12/53* (2013.01)

(58) Field of Classification Search
CPC .......... H05K 1/184; H05K 1/219; H01R 4/02; H01R 12/53; H01R 13/00; H01R 13/646; H01R 13/658; H01R 13/6585; H01R 13/6593; H01R 24/50; H01R 24/542

USPC ......... 174/263; 439/63, 76.1, 445, 497, 581; 343/841
See application file for complete search history.

(56) References Cited

U.S. PATENT DOCUMENTS

| | | | | |
|---|---|---|---|---|
| 4,985,000 | A * | 1/1991 | Tengler | H01R 13/6585 439/445 |
| 6,065,976 | A * | 5/2000 | Wang | H01R 24/50 439/581 |
| 2002/0004321 | A1* | 1/2002 | Anzai | H01P 1/125 439/76.1 |
| 2008/0055180 | A1* | 3/2008 | Noro | H01Q 9/0407 343/841 |
| 2012/0302075 | A1 | 11/2012 | Muraoka et al. | |
| 2014/0057464 | A1* | 2/2014 | Tarulli | H01R 24/50 439/63 |

FOREIGN PATENT DOCUMENTS

| | | |
|---|---|---|
| JP | H4-48802 | 2/1992 |
| JP | 2012-248653 | 12/2012 |

* cited by examiner

*Primary Examiner* — Xiaoliang Chen
(74) *Attorney, Agent, or Firm* — Fujitsu Patent Center

(57) ABSTRACT

A board includes: a signal layer; a first layer and a second layer disposed so as to interpose the signal layer; a connector shell portion embedded on a first surface side of the board; a first solder joint portion that brings the connector shell portion and the first layer to be electrically conductive with each other; a contact portion disposed in a state where a center axis line of the contact portion coincides with a center axis line of the connector shell portion and the contact portion is electrically conductive with the signal layer; and an insulating portion disposed around the contact portion.

12 Claims, 8 Drawing Sheets

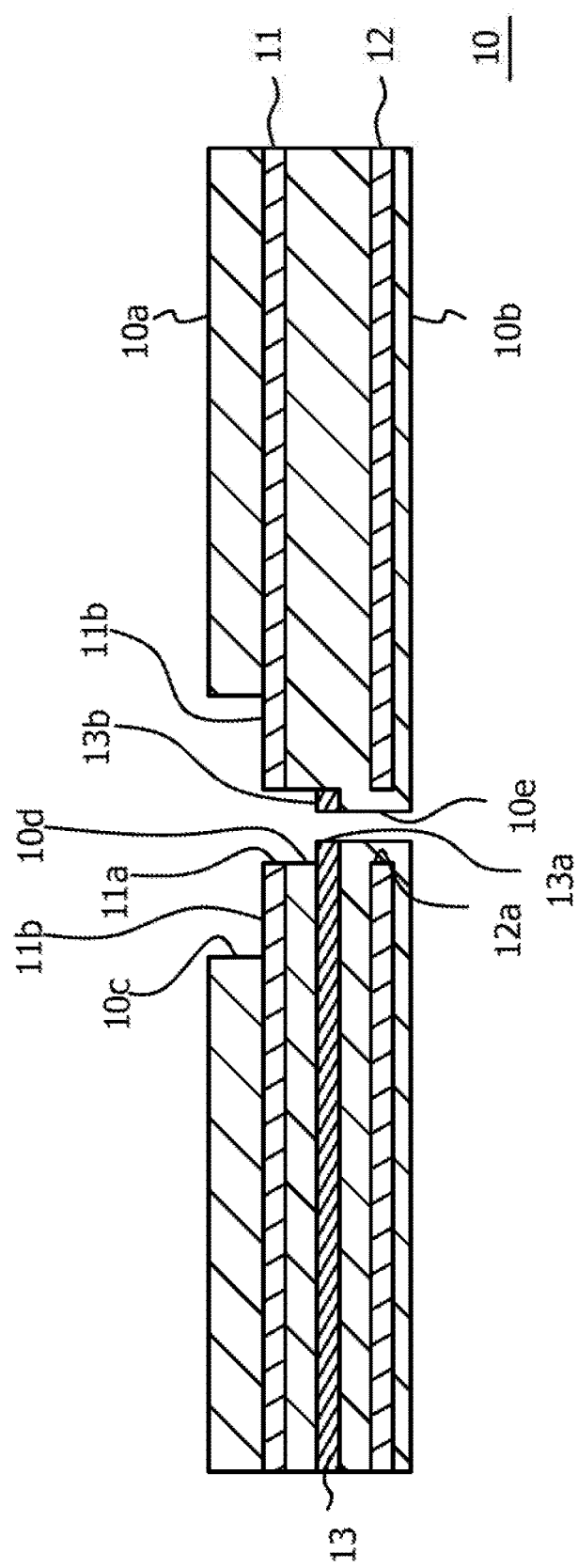

BOARD AND CABLE CONNECTION BOARD

CROSS-REFERENCE TO RELATED APPLICATIONS

This application is based upon and claims the benefit of priority of the prior Japanese Patent Application No. 2016-087351 filed on Apr. 25, 2016, the entire contents of which are incorporated herein by reference.

FIELD

The embodiments discussed herein are related to a board and a cable connection board.

BACKGROUND

A cable is coupled to a board on which a signal wiring is mounted.

Related techniques are disclosed in, for example, Japanese Laid-open Patent Publication Nos. 04-048802 and 2012-248653.

SUMMARY

A board includes: a signal layer; a first layer and a second layer disposed so as to interpose the signal layer; a connector shell portion embedded on a first surface side of the board; a first solder joint portion that brings the connector shell portion and the first layer to be electrically conductive with each other; a contact portion disposed in a state where a center axis line of the contact portion coincides with a center axis line of the connector shell portion and the contact portion is electrically conductive with the signal layer; and an insulating portion disposed around the contact portion.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 2 illustrates an exemplary board in a state where a connector shell portion, a first solder joint portion, a contact portion, an insulating portion, and a second solder joint portion are removed;

DESCRIPTION OF EMBODIMENTS

Figure 1:
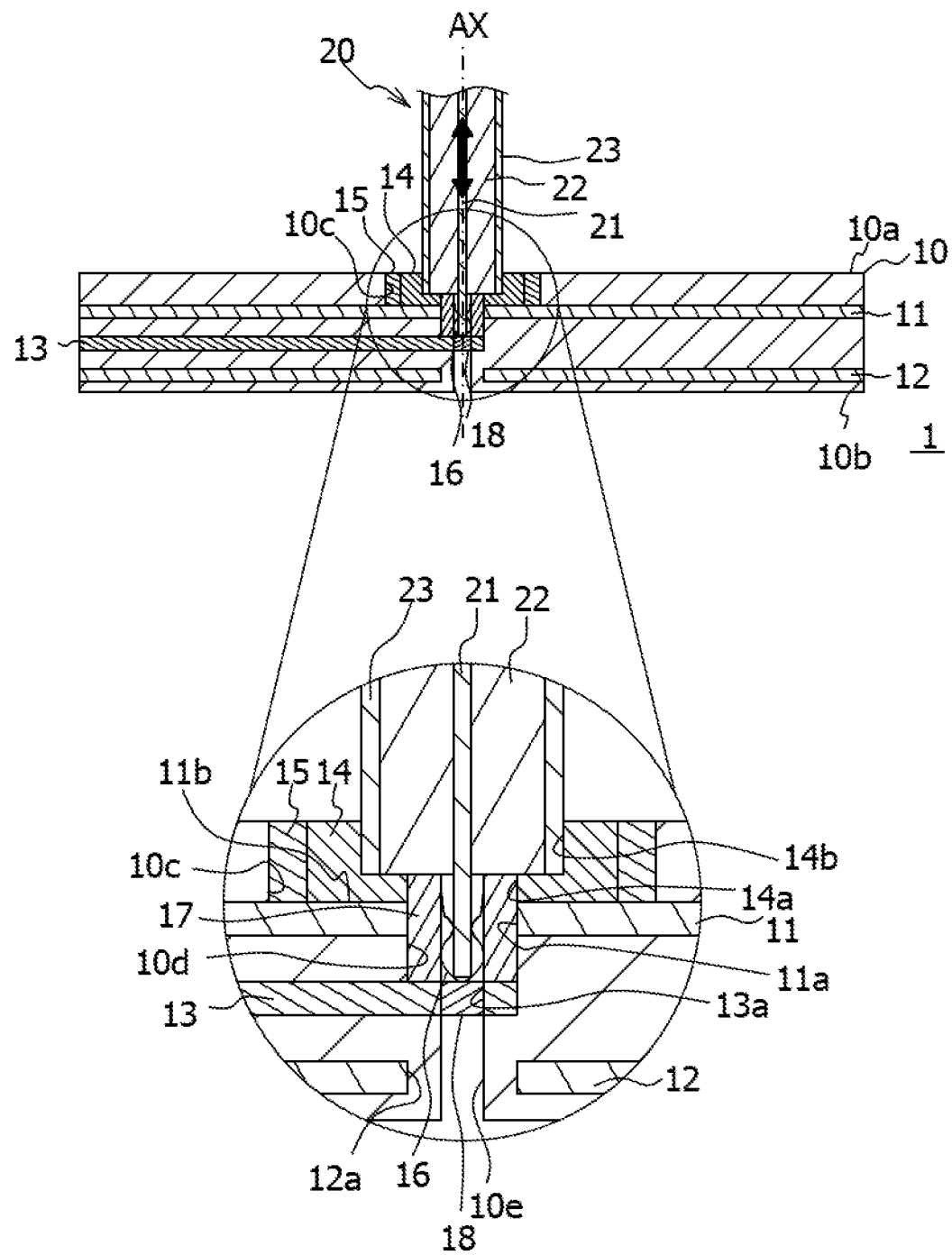
FIG. 1 illustrates an exemplary cable connection board.

For example, a high-speed transmission of 25 Gbps or more may be realized using electrical transmission. When a cable is coupled to a board, an impedance mismatch may occur in a terminal processing portion on which soldering is performed between a cable and a connector contact, or a fitting portion between connectors. When, for example, stubs or through holes are formed in the board, an impedance mismatch may easily occur. The impedance mismatch interferes with high-speed transmission in the electrical transmission. The impedance mismatch may be improved for a board for high-speed transmission.

Hereinafter, in the drawings, sizes, ratios, and the like of the respective units may be illustrated without completely matching the actual ones. Also, in some drawings, for the convenience of explanation, actually existing components may be omitted, or dimensions may be exaggerated in the drawings compared to actual ones.

Figure 3A:
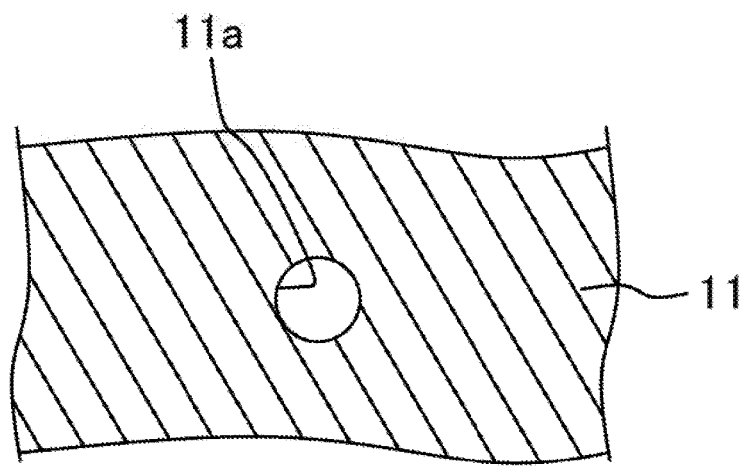
FIG. 3A illustrates an exemplary main part of a first layer.
Figure 3B:
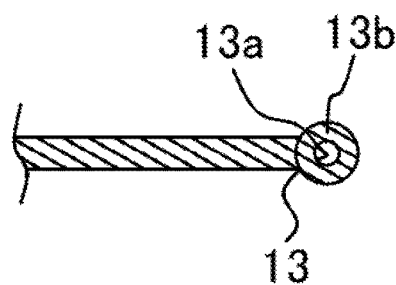
FIG. 3B illustrates an exemplary main part of a signal layer.
Figure 3C:
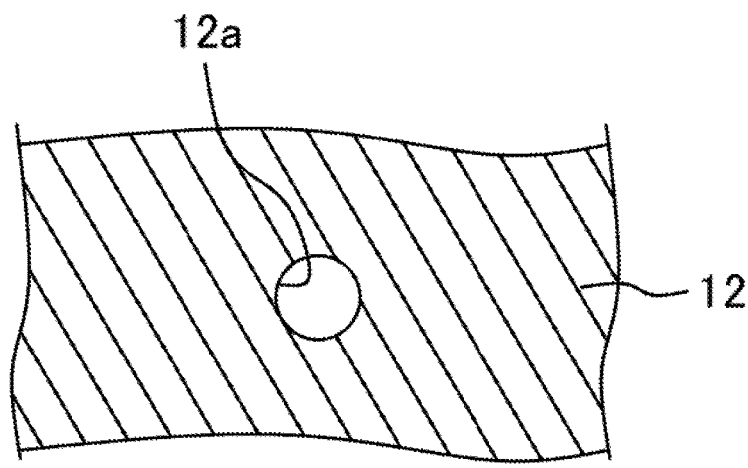
FIG. 3C illustrates an exemplary main part of a second layer.
Figure 4:
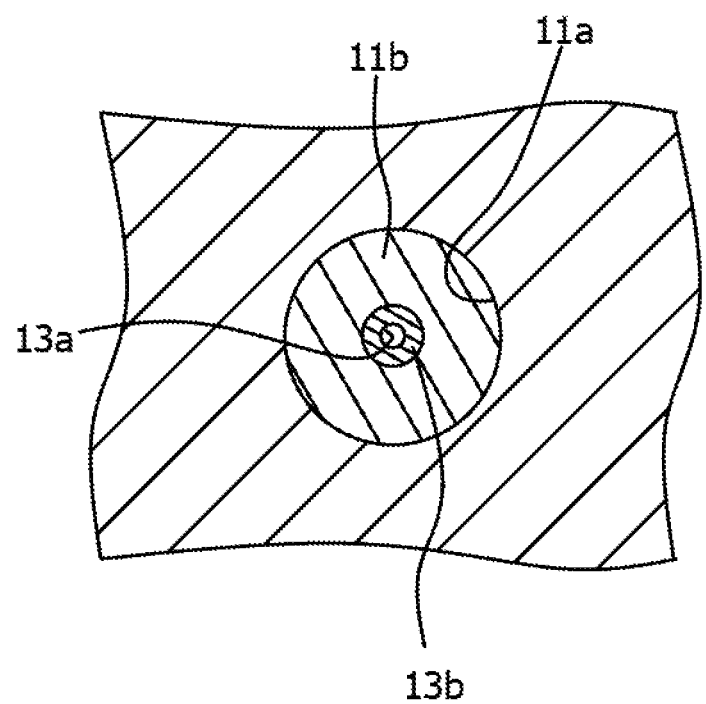
FIG. 4 illustrates an exemplary vicinity of a first opening formed on a first surface side of a board.
Figure 5:
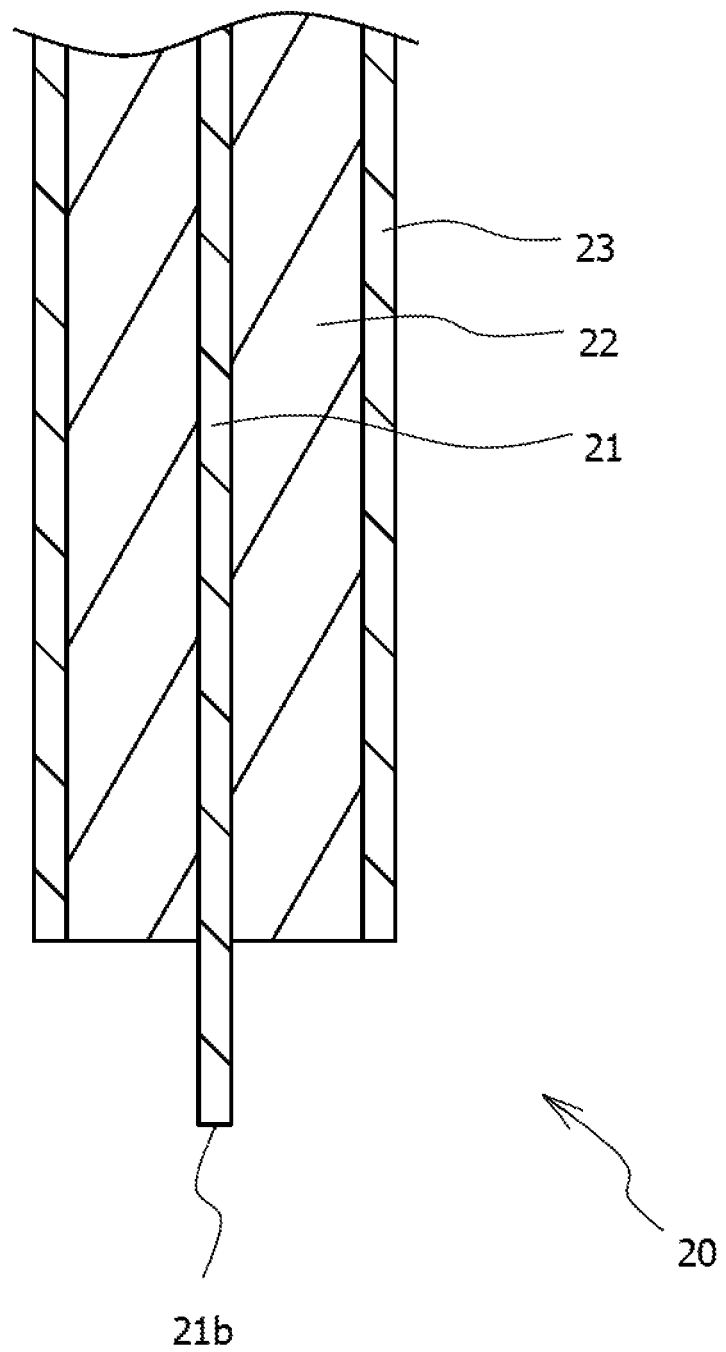
FIG. 5 illustrates an exemplary tip portion of a cable.

FIG. 1 illustrates an exemplary cable connection board. FIG. 2 illustrates an exemplary board in a state where a connector shell portion, a first solder joint portion, a contact portion, an insulating portion, and a second solder joint portion are removed. FIG. 3A illustrates an exemplary main part of a first layer. FIG. 3B illustrates an exemplary main part of a signal layer. FIG. 3C illustrates an exemplary main part of a second layer. FIG. 4 illustrates an exemplary vicinity of a first opening formed on a first surface side of a board. FIG. 5 illustrates an exemplary tip portion of a cable. FIG. 1 and FIG. 2 are sectional views, in which respective members are hatched. FIGS. 3A to 3C and FIG. 4 are not sectional views, but in order to facilitate the understanding of the explanation, respective members illustrated in FIGS. 3A to 3C and FIG. 4 are hatched for each member in common with the members illustrated in FIG. 1 or FIG. 2.

In FIG. 1, a cable 20 is coupled to a board 10 to form a cable connection board 1. The cable 20 is insertable into/removable from the board 10, as indicated by the bi-directional arrow in FIG. 1. In FIG. 2, the board 10 includes a first surface 10a, and a second surface 10b that corresponds to a rear surface side of the first surface 10a. Within the board 10, at least a signal layer 13, and a first layer 11 and a second layer 12 with the signal layer 13 being interposed therebetween are disposed. The first layer 11 is disposed between the signal layer 13 and the first surface 10a in the board 10. The second layer 12 is disposed between the signal layer 13 and the second surface 10b in the board 10.

In FIG. 3A, the first layer 11 has an opening 11a. The vicinity of the opening 11a becomes a land 11b. In FIG. 3B, the signal layer 13 includes a circular portion at an end of a band-shaped portion, and also includes an opening 13a at the center portion of the circular portion. The vicinity of the opening 13a becomes a land 13b as illustrated in FIG. 4. Referring to FIG. 3C, the second layer 12 has an opening 12a.

The first layer 11 is a board ground layer, and the second layer 12 is a board power supply layer. These layers are not limited to these functions, but may have other functions. For example, both the first layer 11 and the second layer 12 may be board ground layers.

In FIG. 2, a first opening 10c is formed on the first surface 10a of the board 10. In this manner, when a resist opening is formed on the outermost surface layer of the board 10, the land 11b is exposed. The land 11b is formed around the opening 11a.

In the board 10, routing is performed form the first surface side to form a second opening 10d having a smaller diameter than the first opening 10c at the center portion of the first opening 10c. The diameter of the second opening 10d substantially coincides with the diameter of the opening 11a formed in the first layer 11, and the inner peripheral wall surface of the second opening 10d and the inner peripheral wall surface of the opening 11a are flush with each other. The second opening 10d reaches the signal layer 13. Accordingly, a state in which the land 13b is exposed inside the second opening 10d is made.

In the board 10, routing is performed from the first surface side to form a third opening 10e having a smaller diameter than the second opening 10d at the center portion of the second opening 10d. The diameter of the third opening 10e substantially coincides with the diameter of the opening 13a formed in the signal layer 13, and the inner peripheral wall surface of the third opening 10e and the inner peripheral wall surface of the opening 13a are flush with each other. The third opening 10e reaches the second surface of the board 10. For example, the third opening 10e forms a space extending from the second surface 10b side to the signal layer 13. The routing of forming the third opening 10e may be performed from the second surface 10b side.

In FIG. 1, the connector shell portion 14 is disposed within the first opening 10c. For example, the connector shell portion 14 is embedded in the board 10 on the first surface 10a side. The first solder joint portion 15 is disposed around the connector shell portion 14. The connector shell portion 14 is made of a conductive material. The connector shell portion 14 is disposed while its bottom surface is in contact with the land 11b. Thus, even in this state, the connector shell portion 14 is in a state of being electrically conductive with the first layer 11. Forming the first solder joint portion 15 widens a contact area between the connector shell portion 14 and the first layer 11. The connector shell portion 14 is embedded in the board 10, and is effective in eliminating an impedance mismatch. The first solder joint portion 15 increases a mounting strength of the connector shell portion 14, thereby contributing to protection of a cable connecting portion.

The connector shell portion 14 has an opening 14a at the center portion thereof, and a concave portion 14b extending around the opening 14a. The cable 20 is inserted into the concave portion 14b so that the outer peripheral wall surface of the concave portion 14b and the outer peripheral wall surface of an outer conductor 23 of the cable 20 are brought into contact with each other, and are electrically conducted, and become a state in which they are coupled to each other. The central axis line of the connector shell portion 14 is AX.

In FIG. 1, the diameter of the opening 14a substantially coincides with the diameter of the second opening 10d formed in the board 10 and the diameter of the opening 11a formed in the first layer 11. A contact portion 16 and an insulating portion 17 are disposed within the opening 14a, the second opening 10d, and the opening 11a. The contact portion 16 is disposed within the board 10 by disposing the insulating portion 17 around the contact portion 16 such that the center axis line of the contact portion 16 substantially coincides with the center axis line AX of the connector shell portion 14. For example, the insulating portion 17 is provided within the opening 14a, the second opening 10d, and the opening 11a, and the contact portion 16 is press-fitted into and held in the insulating portion 17. The contact portion 16 is molded by bending and folding back a conductive metallic material, and has protrusions protruding inwardly. The protrusions are arranged to face each other, and an inner conductor 21 of the cable 20 is clamped by the protrusions so that a state in which the inner conductor 21 and the contact portion 16 are coupled to each other is made. The center axis line of the contact portion 16 is made to substantially coincide with the center axis line AX of the connector shell portion 14 in order to smoothly receive the pin-shaped inner conductor 21. Since the insulating portion 17 is interposed between the contact portion 16 and the first layer 11, the insulation between the contact portion 16 and the first layer 11 is maintained.

In FIG. 1, in the board 10, a second solder joint portion 18 is provided within the opening 13a formed in the signal layer 13. The tip portion of the contact portion 16 is joined to the second solder joint portion 18. Accordingly, the contact portion 16 is electrically conductive with the signal layer 13 through the second solder joint portion 18. The second solder joint portion 18 is provided within the third opening 10e. The second solder joint portion 18 is constructed through the third opening 10e. The second solder joint portion 18 that joins the signal layer 13 with the contact portion 16 through soldering as described above may contribute to the elimination of the impedance mismatch.

The second solder joint portion 18 is provided flush with the signal layer 13. Accordingly, formation of a stub may be avoided, thereby avoiding an impedance mismatch.

In FIG. 5, the cable 20 is a coaxial cable. The cable 20 includes the inner conductor 21 at the center thereof, and an insulator 22 around the inner conductor 21. The outer conductor 23 is provided around the insulator 22. The cable 20 is insertable into/removable from the board 10. When inserted into the board 10, the cable 20 is inserted from the first surface 10a side toward the inside of the board 10. Therefore, the outer peripheral wall surface of the outer conductor 23 comes in contact with the inner peripheral wall surface of the concave portion 14b of the connector shell portion 14 while the inner conductor 21 is caught and inserted in the contact portion 16. The cable 20 is inserted into the board 10 in this manner, thereby forming the cable connection board 1.

The board 10 is coupled to the cable 20 through the connector shell portion 14 and the contact portion 16. Both the connector shell portion 14 and the contact portion 16 that correspond to a connecting portion to be connected to the cable 20 are provided within the board 10. Thus, in the board 10, a wiring length is shortened. An increase of the wiring length causes a noise. Meanwhile, in the board 10, the wiring length is decreased and thus reduces a noise, so that a cable connection suitable for high-speed transmission may be made. Since the connector shell portion 14 and the contact portion 16 are disposed within the board 10, a noise may be effectively reduced. In this manner, through an impedance control design in which the connector shell portion 14 and the contact portion 16 are disposed within the board 10, characteristic impedances of the board 10 and the cable 20 substantially match. The cable connection board 1 and the board 10 in which the impedance mismatch is reduced as described above are effective in the high-speed transmission.

In the cable connection board 1 and the board 10, since both the connector shell portion 14 and the contact portion 16 that correspond to a connecting portion to be connected to the cable 20 are provided within the board 10, a component mounting height is reduced. Thus, the unit may be thinned. In the cable connection board 1 and the board 10, since portions to be connected to the cable 20 are located within the board 10, crosstalk with an adjacent signal line system may be reduced. In the cable connection board 1, since the inner conductor 21 is joined to the signal layer 13 within the board 10, a shielding property against an external noise may be high, thereby reducing an electromagnetic interference caused by a radiation noise (EMI: Electro-Magnetic Interference).

In the cable connection board 1 and the board 10, since the cable 20 is inserted and removed, for example, a change of the board 10 to be connected, or a replacement of the board 10 may be easily performed.

Since the cable connection board 1 and the board 10 use an electrical transmission, high-speed transmission may be performed inexpensively as compared to optical transmission.

Figure 6:
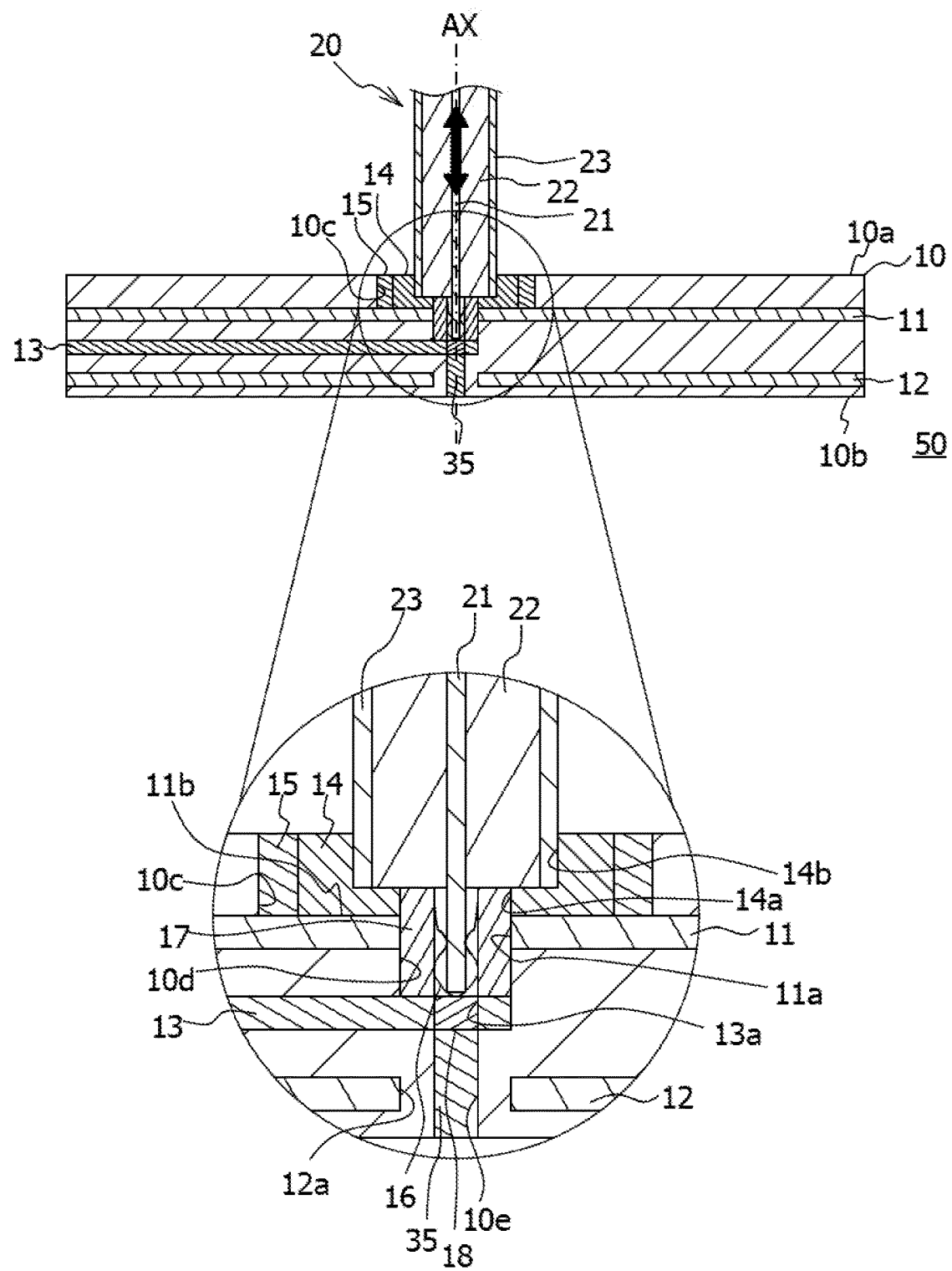
FIG. 6 illustrates another exemplary cable connection board.

FIG. 6 illustrates another exemplary cable connection board. A cable connection board 50 illustrated in FIG. 6 is different from the cable connection board 1 illustrated in FIG. 1 in that the cable connection board 50 includes a dielectric 35. In another configuration illustrated in FIG. 6, configurations which are substantially the same as or similar to those illustrated in FIG. 1 are denoted by the same reference numerals, and descriptions thereof may be omitted.

The dielectric 35 seals the second solder joint portion 18 disposed within a space formed as the third opening 10e in the board 10 at the second surface 10b side. In this manner, the second solder joint portion 18 is sealed by the dielectric 35, so that the contact of the second solder joint portion 18 with the atmosphere, and further, the contact of a connecting portion between the signal layer 13 and the inner conductor 21 with the atmosphere may be reduced. As a result, a noise may be reduced.

The dielectric 35 illustrated in FIG. 6 is embedded in the third opening 10e so as to be substantially flush with the second surface 10b. However, as long as the second solder joint portion 18 is sealed by the dielectric 35, the dielectric 35 may not be necessarily substantially flush with the second surface 10b.

In the cable connection board 50 illustrated in FIG. 6, the effect which is the same as or similar to that of the cable connection board 1 illustrated in FIG. 1 may be obtained, and also a noise may be reduced because the second solder joint portion 18 is sealed.

Figure 7:
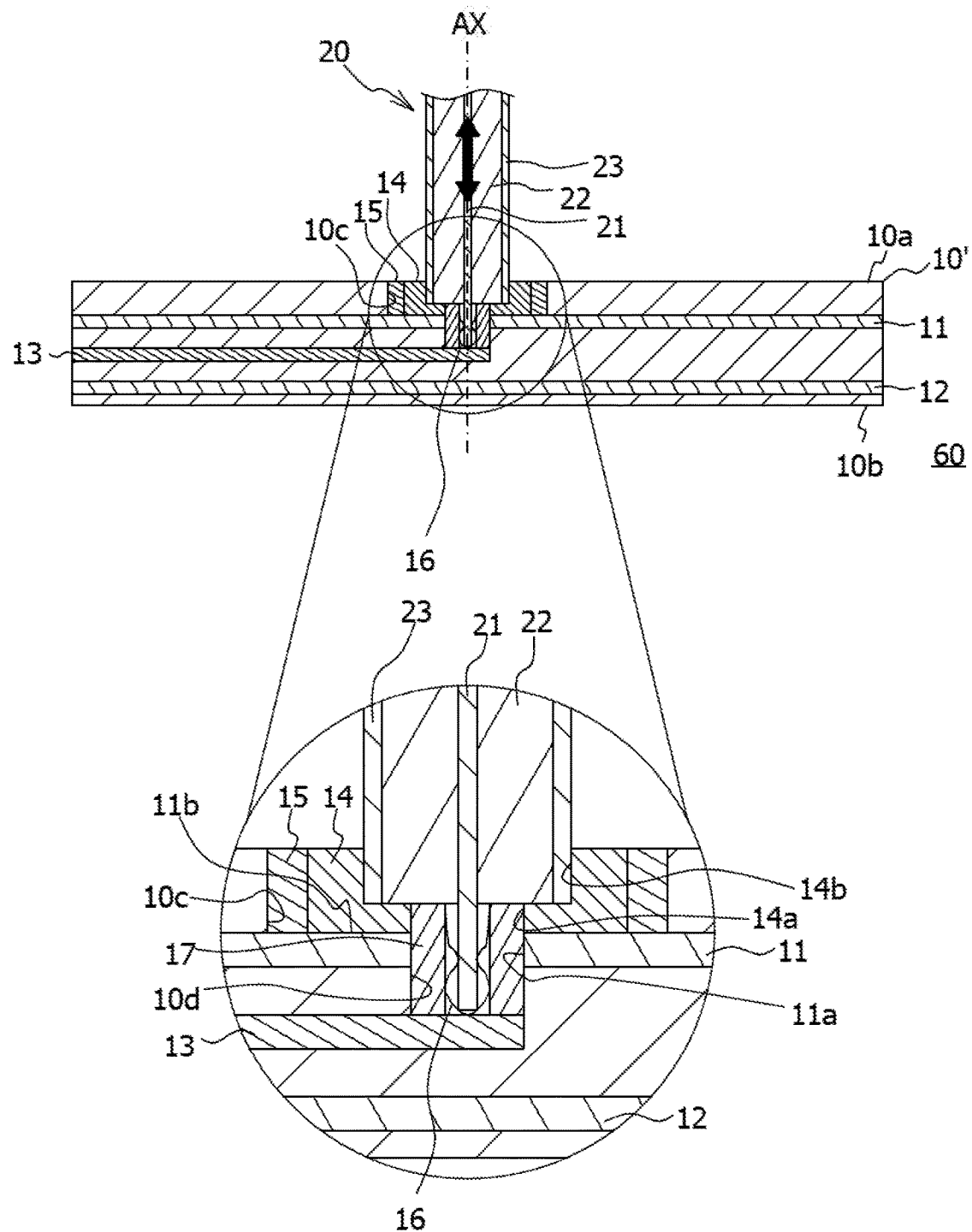
FIG. 7 illustrates a further exemplary cable connection board.
Figure 8:
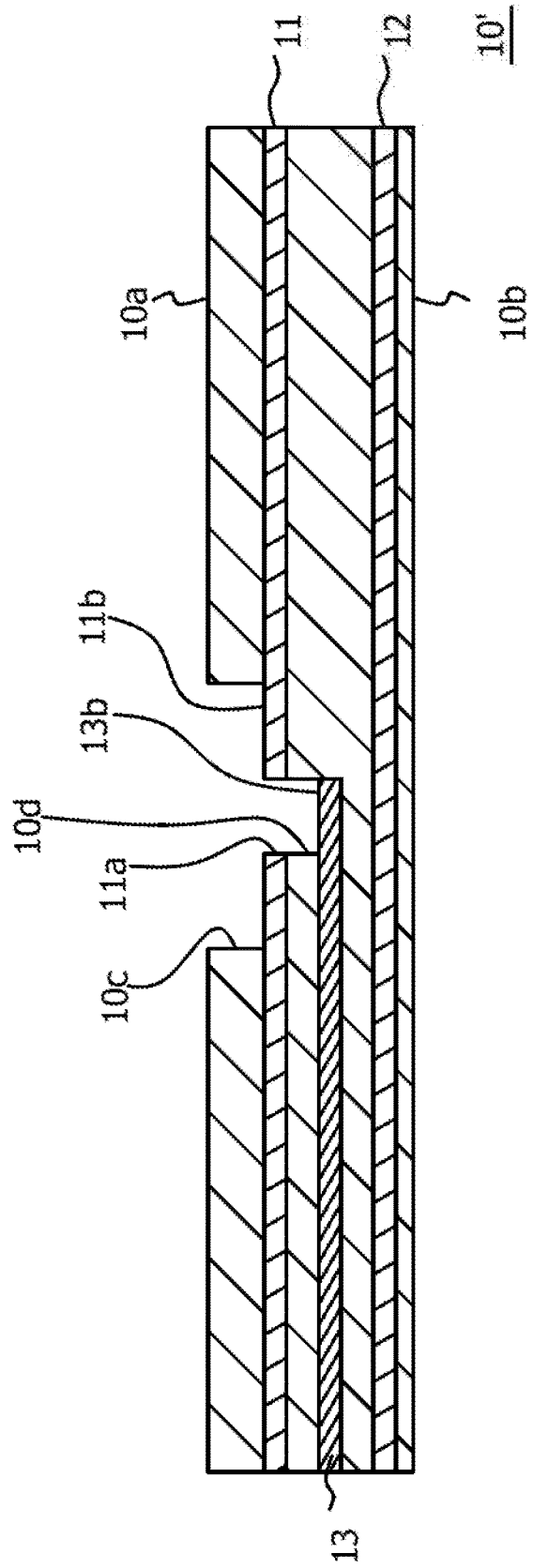
FIG. 8 illustrates an exemplary board in a state where a connector shell portion, a first solder joint portion, a contact portion, and an insulating portion are removed.

FIG. 7 illustrates a further exemplary cable connection board. FIG. 8 illustrates an exemplary board in a state where a connector shell portion, a first solder joint portion, a contact portion, and an insulating portion are removed. A cable connection board 60 illustrated in FIG. 7 is different from the cable connection board 1 illustrated in FIG. 1 in that a board 10' included in the cable connection board 60 does not have the third opening 10e, the opening 13a of the signal layer 13, and the second solder joint portion 18. In the board 10 illustrated in FIG. 1, the signal layer 13 and the contact portion 16 are coupled through the second solder joint portion 18 provided within the third opening 10e. In contrast, in the board 10' illustrated in FIG. 7, the tip portion of the contact portion 16 press-fitted into the insulating portion 17 provided within the second opening 10d comes in contact with the land 13b of the signal layer 13, thereby coupling the signal layer 13 to the contact portion 16. In another configuration illustrated in FIG. 7, configurations which are substantially the same as or similar to those illustrated in FIG. 1 are denoted by the same reference numerals, and descriptions thereof may be omitted.

In the board 10' illustrated in FIG. 7 as well, the connector shell portion 14 and the contact portion 16 are disposed within the board 10', and thus are effective in eliminating an impedance mismatch. In FIG. 7, like in FIG. 1, crosstalk with an adjacent signal line system may be reduced. In FIG. 7, since the inner conductor 21 is joined to the signal layer 13 within the board 10', a shielding property against an external noise may be high, thereby reducing an electromagnetic interference caused by a radiation noise (EMI: Electro-Magnetic Interference).

In FIG. 7, since the third opening 10e, the opening 13a of the signal layer 13, and the second solder joint portion 18 are eliminated, processes of providing these may be omitted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A board comprising:
   a signal layer;
   a first layer and a second layer disposed so as to interpose the signal layer;
   a connector shell portion embedded on a first surface side of the board;
   a first solder joint portion that brings the connector shell portion and the first layer to be electrically conductive with each other;
   a contact portion disposed in a state where a center axis line of the contact portion coincides with a center axis line of the connector shell portion and the contact portion is electrically conductive with the signal layer; and
   an insulating portion disposed around the contact portion.

2. The board according to claim 1, further comprising:
   a space extending from a second surface side opposite to the first surface side to the signal layer;
   a second solder joint portion disposed within the space to join the signal layer to the contact portion; and
   a dielectric disposed within the space to seal the second solder joint portion.

3. The board according to claim 1, further comprising:
   a space extending from a second surface side opposite to the first surface side to the signal layer; and
   a second solder joint portion disposed within the space to join the signal layer to the contact portion,
   wherein the second solder joint portion is provided within an opening formed in the signal layer.

4. The board according to claim 3, wherein the second solder joint portion is provided flush with the signal layer.

5. The board according to claim 1, wherein the first layer includes a land exposed inside an opening formed on the first surface side, and
   the first solder joint portion is disposed around the connector shell portion within the opening.

6. The board according to claim 1, wherein the contact portion is press-fitted into the insulating portion in a state where a tip portion of the contact portion is in contact with the signal layer.

7. A cable connection board comprising:
   a board; and
   a cable inserted into the board,
   wherein the board includes:
   a signal layer;
   a first layer and a second layer so as to interpose the signal layer;
   a connector shell portion embedded at a first surface side;

a first solder joint portion that brings the connector shell portion and the first layer to be electrically conductive with each other;

a contact portion disposed in a state where a center axis line of the contact portion coincide with a center axis line of the connector shell portion and the contact portion is electrically conductive with the signal layer; and an insulating portion disposed around the contact portion, wherein the cable includes an outer conductor in contact with the connector shell portion, and an inner conductor in contact with the contact portion.

8. The cable connection board according to claim 7, wherein the board includes:

a space extending from a second surface side opposite to the first surface side to the signal layer;

a second solder joint portion disposed within the space to join the signal layer to the contact portion; and a dielectric disposed within the space to seal the second solder joint portion.

9. The cable connection board according to claim 7, wherein the board includes:

a space extending from a second surface side opposite to the first surface side to the signal layer; and a second solder joint portion disposed within the space to join the signal layer to the contact portion, wherein the second solder joint portion is provided within an opening formed in the signal layer.

10. The cable connection board according to claim 9, wherein the second solder joint portion is provided flush with the signal layer.

11. The cable connection board according to claim 7, wherein the first layer includes a land exposed inside an opening formed on the first surface side, and the first solder joint portion is disposed around the connector shell portion within the opening.

12. The cable connection board according to claim 7, wherein the contact portion is press-fitted into the insulating portion in a state where a tip portion of the contact portion is in contact with the signal layer.

* * * * *